United States Patent
Fan

[19]

[11] Patent Number: 5,888,701
[45] Date of Patent: Mar. 30, 1999

[54] METHOD FOR MAKING A FLEXOGRAPHIC PRINTING PLATE FROM A FLEXOGRAPHIC PRINTING ELEMENT HAVING A POWDER LAYER

[75] Inventor: Roxy Fan, E. Brunswick, N.J.

[73] Assignee: E. I. du Pont de Nemours and Company, Wilmington, Del.

[21] Appl. No.: 937,241

[22] Filed: Oct. 1, 1997

Related U.S. Application Data

[62] Division of Ser. No. 675,455, Jul. 3, 1996.

[51] Int. Cl.⁶ ...................................................... G03F 7/26
[52] U.S. Cl. ........................... 430/306; 430/300; 430/327; 430/328; 430/309; 430/291; 430/270.1; 430/273.1; 430/945; 430/944
[58] Field of Search ..................... 430/306, 300, 430/327, 328, 309, 291, 270.1, 273.1, 945, 5

[56] References Cited

U.S. PATENT DOCUMENTS

| | | | |
|---|---|---|---|
| 2,649,382 | 8/1953 | Vesce | 106/193 |
| 3,036,913 | 5/1962 | Burg | 96/67 |
| 3,620,726 | 11/1971 | Chu et al. | 96/27 R |
| 3,909,282 | 9/1975 | Gray | 106/288 |
| 4,044,385 | 8/1977 | Nishimura et al. | 358/300 |
| 4,132,168 | 1/1979 | Peterson | 101/471 |
| 4,229,518 | 10/1980 | Gray et al. | 430/273 |
| 4,238,560 | 12/1980 | Nakamura et al. | 430/162 |
| 4,269,933 | 5/1981 | Pazos | 430/291 |
| 4,292,389 | 9/1981 | Kojima et al. | 430/169 |
| 4,323,636 | 4/1982 | Chen | 430/271 |
| 4,427,759 | 1/1984 | Gruetzmacher et al. | 430/273 |
| 4,429,027 | 1/1984 | Chambers, Jr. et al. | 430/5 |
| 4,737,446 | 4/1988 | Cohen et al. | 430/311 |
| 4,859,571 | 8/1989 | Cohen et al. | 430/272 |
| 5,112,726 | 5/1992 | Cohen et al. | 430/315 |
| 5,260,166 | 11/1993 | Nazzaro et al. | 430/271 |
| 5,262,275 | 11/1993 | Fan | 430/273 |
| 5,506,086 | 4/1996 | Van Zoeren | 430/201 |
| 5,529,884 | 6/1996 | Tutt et al. | 430/269 |
| 5,607,814 | 3/1997 | Fan | 430/258 |

FOREIGN PATENT DOCUMENTS

| | | | |
|---|---|---|---|
| 0 599 720 A2 | 11/1993 | European Pat. Off. | G03G 1/00 |
| 0 634 695 A1 | 6/1994 | European Pat. Off. | G03F 1/00 |
| 0 741 330 A1 | 11/1996 | European Pat. Off. | G03F 1/00 |
| 41 17 126 A1 | 11/1992 | Germany | G03F 7/40 |
| 4117127 A1 | 11/1992 | Germany | G03F 7/09 |
| 75/125805 | 9/1979 | Japan | G03C 1/76 |
| 75/125805 | 5/1981 | Japan | G03F 7/20 |
| 57-16350 | 4/1982 | Japan | G03F 7/02 |
| 1-47772 | 10/1989 | Japan | G03C 1/00 |
| PCT/US93/07075 | 8/1993 | WIPO | G03F 7/095 |
| WO 94/03839 | 2/1994 | WIPO | G03F 7/095 |
| WO 96/16356 | 5/1996 | WIPO | G03F 7/095 |

OTHER PUBLICATIONS

US Appln. Serial No. 08/402,762; Ma et al., "Process of Photoimaging Using Ink Jet Printing"—abandoned Jan. 26, 1997.

*Primary Examiner*—Marion McCamish
*Assistant Examiner*—Cheryl Juska
*Attorney, Agent, or Firm*—Thomas H. Magee

[57] ABSTRACT

A photosensitive printing element having an overall layer of powder material and a process for making a flexographic printing plate from such an element are disclosed. The photosensitive element includes a support, a photopolymerizable layer, and a layer of powder material on the photopolymerizable layer. The layer of powder material can be opaque or transparent depending upon desired use.

8 Claims, 1 Drawing Sheet

METHOD FOR MAKING A FLEXOGRAPHIC PRINTING PLATE FROM A FLEXOGRAPHIC PRINTING ELEMENT HAVING A POWDER LAYER

This is a division of application Ser. No. 08/675,455, filed Jul. 3, 1996 allowed.

BACKGROUND OF THE INVENTION

1. Field of the Invention

This invention relates to a photosensitive element having a layer of powder material, and in particular to a photopolymeric element useful in flexographic printing having an overall layer of powder on a surface of the photopolymerizable layer. The invention also relates to methods for making a flexographic printing plate from the photosensitive element.

2. Description of Related Art

Flexographic printing plates are well known for use in printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a photopolymerizable layer interposed between a support and a coversheet or multilayer cover element, and a release layer on the photopolymerizable layer to prevent adherence of a phototool. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

Imagewise exposure of a photosensitive element requires the use of a phototool which is a mask having clear and opaque areas covering the photopolymerizable layer. The phototool prevents exposure and polymerization in the opaque areas. The phototool allows exposure to radiation in the clear areas so that these areas polymerize and remain on the support after the development step. The phototool is usually a photographic negative of the desired printing image.

In some applications, it is desirable to eliminate the phototool by directly recording information on a photosensitive element, e.g., by means of a laser beam. In particular, digitized imaging without a phototool is well-suited for making seamless, continuous printing forms. The image to be developed could be translated into digital information and the digital information used to place the laser for imaging. The digital information can be transmitted from a distant location, corrected easily and quickly by adjusting the digitized image, and precisely controlled by a machine during imaging. Digitized imaging can also reduce storage space and costs by eliminating the need for positive- and negative-working photosensitive materials or positive and negative phototools.

In general, it has not been very practical to use lasers to image the photopolymerizable layer of the elements which are used to prepare flexographic printing plates. The elements have low photosensitivity and require long exposure times even with high powered lasers. In addition, most of the photopolymerizable materials used in these elements have their greatest sensitivity in the ultraviolet range. While UV lasers are known, economical and reliable UV lasers with high power, such as the ion laser, are generally not available. In UV lasers, such as the excimer laser, the laser cannot be modulated quickly enough to create a precise image at high write speeds. However, non-UV lasers are available which are relatively inexpensive, and which have a useful power output and which can be utilized to form a mask image on top of flexographic printing elements.

U.S. Pat. No. 5,262,275 and pending U.S. patent applications Ser. No. 08/130,610 and Ser. No. 08/341,731, describe a photosensitive element and processes for making flexographic plates which use laser radiation to form an image on a layer on the element. The element comprises a support, a photopolymerizable layer, at least one barrier layer, and at least one layer of infrared radiation sensitive material. The process includes the step of imagewise ablation of the layer of infrared radiation sensitive material with infrared laser radiation to form an in-situ mask. The element is then exposed to actinic radiation through the mask and treated with developer solution. The infrared-sensitive layer includes an infrared-absorbing material, a radiation-opaque material (which can be the same as the infrared-absorbing material) and optionally, a binder. The infrared-sensitive layer can be prepared by coating the infrared-sensitive material onto a temporary coversheet or directly onto the barrier layer on the photopolymerizable layer. If the infrared-sensitive layer is on the temporary coversheet, the infrared sensitive layer is placed on the photopolymerizable layer (barrier layer) of a second element and the layers are pressed together.

U.S. Pat. No. 5,262,275 and the related applications disclose coating (i.e. materials in solution) as a method to form the infrared sensitive layer. The infrared sensitive layer can be formed by coating the infrared radiation sensitive material in one pass or in multiple passes. However, the various methods of coating do not always provide the necessary high covering power for the infrared sensitive layer. Covering power relates to the ability of a composition to form a layer relative to density (optical) and coating thickness, i.e., coating weight, of the layer. High covering power of a composition, e.g., infrared radiation sensitive material, achieves high optical density with a minimum coating thickness of the layer. Generally, a composition having poor covering power provides a thick coating layer in order to reach desired optical density. Poor covering power results in lower ablation sensitivity, detrimentally affecting ablation performance and thus the ultimate print productivity of the plate. Further, when the infrared sensitive layer is coated from an infrared sensitive material in solvent solution, the infrared sensitive layer may develop cracking or crazing appearance on the photosensitive element. This can particularly occur when the infrared sensitive layer is coated onto a cylindrically-shaped photopolymeric layer directly.

The process of desolvation-removing solvent from the coating layer, may result in plates or cylindrical plates which develop cracks or weaknesses in the coating layer over time. There is a need, therefore, for a flexographic printing element which does not have such problems. The present invention meets this need by providing flexographic printing elements and plates wherein an infrared ablatable composition which forms a mask or a release composition is manufactured or produced which does not have a discrete film-like infrared ablatable layer or release layer. This invention also provides seamless coverage for the cylindrical flexographic printing plate having an IR ablatable layer.

U.S. Pat. No. 4,229,518 describes a photohardenable element useful for color proofing which contains a protective topcoat. The protective topcoat comprises a layer of a tacky material dusted with a powdered material capable of rendering the layer non-tacky and the element suitable for further handling. The tacky material includes unexposed photohardenable monomer and plasticizer. The application of the topcoat is a final step in the formation of a toned image-bearing element. Thus the image-bearing element having a layer of powdered material as a topcoat is not subjected to any additional process treatments such as laser ablation of the layer, overall exposure of the element to actinic light, and washout to remove unexposed areas. Also the image bearing element does not form a relief structure suitable for flexographic printing.

SUMMARY OF THE INVENTION

The present invention broadly relates to a flexographic printing element, comprising:

(a) a support; and (b) at least one photopolymerizable layer on the support which is capable of forming a relief upon development comprising an elastomeric binder, at least one monomer and an initiator; wherein said photopolymerizable layer has an exterior surface opposite the support which is tacky or substantially tacky and wherein said exterior surface has solid, particulate material covering at least an imageable portion of said surface. The term "imageable portion" means at least the portion (including the entire perimeter or boundary) of the surface area of the photopolymerizable layer which is to be imagewise ablated and exposed and/or covered with a phototool and not including areas outside of the area which is subject to ablation or contact with a phototool.

The present invention also relates to a flexographic printing element, comprising:

(a) a support;

(b) at least one photopolymerizable layer on the support comprising an elastomeric binder, at least one monomer and an initiator, an exterior surface of the photopolymerizable layer opposite the support being tacky or substantially tacky wherein the photopolymerizable layer is capable of forming a relief; and (c) a material layer on the exterior surface of the photopolymerizable layer.

The "material layer" is a release layer or an infrared ablatable layer and may be comprised of a variety of compositions or blends of such compositions wherein said layer either functions as a release layer or as an infrared ablatable layer and wherein said layer is applied to the surface of the photopolymerizable layer to ultimately result in a dry particulate layer. The material layer is not applied in an imagewise fashion but, instead, covers an entire square area or sub-square area of the photopolymerizable layer. In either embodiment, the material layer adheres to the tacky or substantially tacky photopolymerizable layer and is difficult to remove as a discrete film layer. The compositions or blends are typically applied in powder or powder-like (eg. particulate) form but said compositions or blends are not limited to powders and may ultimately be any dry (non-solvated) solid material as described above including crystalline material or solid aggregates.

The material layer, in some form, appears to integrate into the tacky surface of the photopolymerizable layer but may be removable during development of the photosensitive element if desired.

In accordance with this invention there is further provided a flexographic printing element comprising:

(a) a support;

(b) at least one photopolymerizable layer on the support comprising an elastomeric binder, at least one monomer and an initiator, an exterior surface of the photopolymerizable layer opposite the support being tacky or substantially tacky, and wherein the photopolymerizable layer is capable of forming a relief; and (c) a powder covering the exterior surface of the photopolymerizable layer.

In accordance with another aspect of this invention methods of forming a flexographic printing plate from the element described above are provided.

DETAILED DESCRIPTION

The Photosensitive Element

Figure 1:
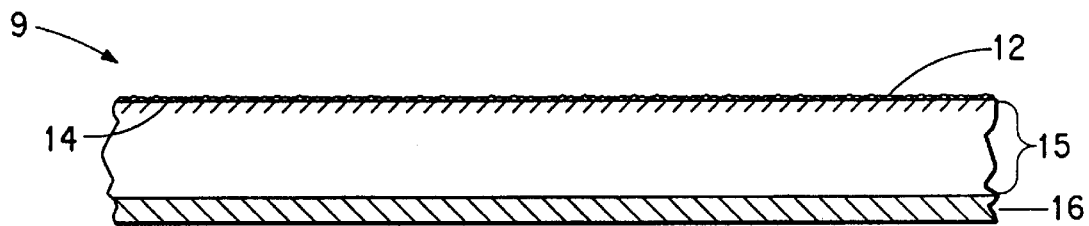
FIG. 1 depicts an element (9) as recited and claimed herein. The element comprises a support (16), a photopolymerizable layer (15) and a layer of powder material (12). Also shown is an oily (tacky) portion (14) of the photopolymerizable layer.
Figure 2:
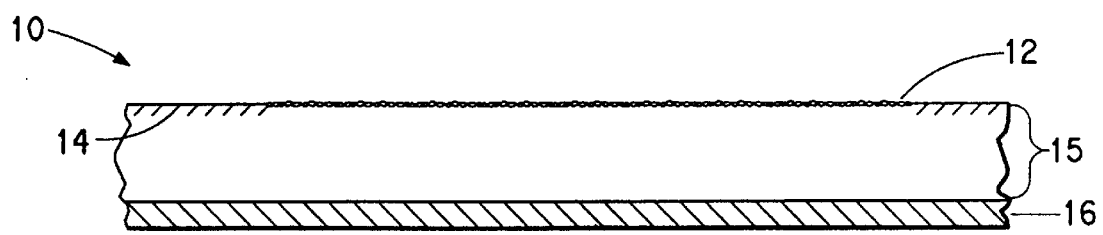
FIG. 2 depicts an element (10) comprising a support (16) and a photopolymerizable layer (15) with a tacky surface (14) wherein a powder material is embedded or substantially or partially embedded in the tacky portion of the photopolymerizable layer and, while covering the surface of the photopolymerizable layer, is also part of this layer.
Figure 3:
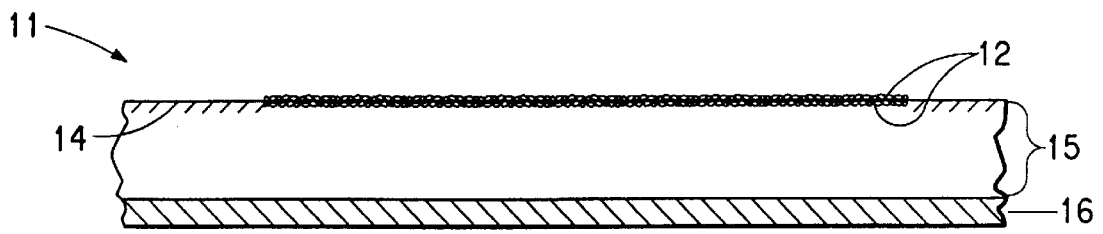
FIG. 3 depicts an element (11) with powder material embedded in the tacky surface (14) while also having an additional powder layer covering the surface of the photopolymerizable layer (15).

A flexographic printing element is a photosensitive element useful for making a flexographic printing plate. The photosensitive element comprises, in order, a support, at least one photopolymerizable layer, and a layer of a powder material. The element can optionally include an adhesive layer between the support and the photopolymerizable layer or a surface of the support can have an adhesion promoting surface. An exterior surface of the photopolymerizable layer opposite the support is tacky to adhere the layer of powder material. The layer of powder material completely covers the exterior surface of the photopolymerizable layer.

The layer of powder or powder covering can function in various capacities for the element. The layer of powder material on the photopolymerizable layer can function as a release layer, providing the element with a tack-free surface and enabling good vacuum drawdown and easy removal of a phototool film after imagewise exposure of the element. If the layer of powder material absorbs laser radiation and is opaque to actinic light, the layer can be imagewise removed by laser radiation to form an in-situ mask on the element. In addition, the powder material layer can alter the surface characteristics of the photopolymerizable layer and provide, for example, a roughened surface on the element and alter ink pickup or ink release characteristics of the plate. A photopolymerizable layer having a roughened surface can eliminate the need for a phototool to have a matte surface.

The support can be any flexible material which is conventionally used with photosensitive elements used to prepare flexographic printing plates. Examples of suitable support materials include polymeric films such those formed by addition polymers and linear condensation polymers, transparent foams and fabrics, and metals such as aluminum. A preferred support is a polyester film; particularly preferred is polyethylene terephthalate. The support typically has a thickness from 2 to 10 mils (0.0051 to 0.025 cm), with a preferred thickness of 3 to 8 mils (0.0076 to 0.020 cm).

Optionally, the element includes an adhesive layer between the support and the photopolymerizable layer, or a surface of the support has an adhesion promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in Burg, U.S. Pat. No. 3,036,913 are also effective. Materials suitable as an adhesive layer include thermally activated adhesives, such as hot melt adhesives, and thermoplastic-elastomeric binders. Thermally activated adhesives are solid materials which soften at elevated temperatures to enable them to act as adhesives. Suitable hot melt adhesives can be found in "Handbook of Adhesives", edited by I. Skeist, second edition, Van Nostrand Reinhold Company, N.Y., 1977, particularly Chapters 30 and 35. Examples of hot melt adhesives include, but are not limited to, polyamides, polyacrylates, polyolefins, polyurethanes, polyisobutylenes, polyvinyl resins, polyester resins, and copolymers and blends of these and other polymers. Thermoplastic-elastomeric binders suitable for use as adhesives are the same as the elastomeric binders described for photopolymerizable layer. The coating on the support can be 40 angstrom to 40 microns thick. Alternatively, the surface of the support on which the photopolymerizable layer resides can be treated to promote adhesion between the support and the photopolymerizable layer, with flame-treatment or electron-treatment, e.g., corona-treated. Further, the adhesion of the photosensitive layer to the support can be adjusted by exposing the element to actinic radiation through the support as disclosed by Feinberg et al. in U.S. Pat. No. 5,292,617.

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to actinic radiation. Throughout this specification actinic light will include ultraviolet radiation and/or visible light. In most cases, the initiator will be sensitive to visible or ultraviolet radiation. Any photopolymerizable compositions which are suitable for the formation of flexographic printing plates can be used for the present invention. Examples of suitable compositions have been disclosed, for example, in Chen et al., U.S. Pat. No. 4,323,637, Grüetzmacher et al., U.S. Pat. No. 4,427,759 and Feinberg et al., U.S. Pat. No. 4,894,315. The composition of the photopolymerizable layer is thus capable of forming a relief suitable for printing.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al., U.S. Pat. No. 4,430,417; and Toda et al., U.S. Pat. No. 4,045,231 can be used. It is preferred that the binder be present in at least an amount of 55% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art and include but are not limited to addition-polymerization ethylenically unsaturated compounds having relatively low molecular weights (generally less than about 30,000), and preferably having molecular weight less than about 5000. Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5 by weight of the photopolymerizable layer.

The photoinitiator can be any single compound or combination of compounds which is sensitive to actinic radiation, generating free radicals which initiate the polymerization of the monomer or monomers without excessive termination. The photoinitiator is generally sensitive to actinic light, and preferably sensitive to ultraviolet radiation. In cases where the layer of powder material on the photopolymerizable layer is exposed to laser radiation to form an in-situ mask, the photoinitiator must also be insensitive to the laser radiation. For example, where the photosensitive element is exposed to infrared laser radiation to form an in-situ mask, the photoinitiator must also be insensitive to infrared radiation. With infrared laser radiation, the photoinitiator should also be thermally inactive at and below 185° C. Examples of suitable photoinitiators include the substituted and unsubstituted polynuclear quinones. Examples of suitable systems have been disclosed in Grüetzmacher U.S. Pat. No. 4,460,675 and Feinberg et al., U.S. Pat. No. 4,894,315. Photoinitiators are generally present in amounts from 0.001% to 10.0% based on the weight of the photopolymerizable composition.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; liquid polyisoprene; polystyrene; poly-alpha-methyl styrene; alpha-methylstyrene-vinyltoluene copolymers; pentaerythritol ester of hydrogenated rosin; polyterpene resins; and ester resins. Generally, plasticizers are liquids having molecular weights of less than about 5000, but can have molecular weights up to about 30,000. Plasticizers having low molecular weight will encompass molecular weights less than about 30,000.

The photopolymerizable layer can contain other additives depending on the final properties desired. Such additives include sensitizers, plasticizers, rheology modifiers, thermal polymerization inhibitors, tackifiers, colorants, antioxidants, antiozonants, or fillers.

The thickness of the photopolymerizable layer can vary over a wide range depending upon the type of printing plate desired. For so called "thin plates" the photopolymerizable layer can be from about 20 to 67 mils (0.05 to 0.17 cm) in thickness. Thicker plates will have a photopolymerizable layer up to 100–250 mils (0.25 to 0.64 cm) in thickness or greater.

Unless otherwise indicated, the terms "flexographic printing plate" or "flexographic printing element" encompass plates or elements in any form suitable for flexographic printing, including, but not limited to, flat sheets and seamless continuous forms. Continuous printing relief forms have applications in the flexographic printing of continuous designs such as in wallpaper, decoration and gift wrapping paper. For seamless continuous forms, it is preferred that the photosensitive element is a seamless photopolymeric sleeve.

For purposes of this invention, the term "seamless" as applied to the at least one photopolymerizable layer means that the photopolymerizable layer is a continuum of photopolymeric material whereby no line of demarcation or joining of the photopolymeric material as a layer or other defect influencing print quality is present at least on an outer circumferential surface, i.e., printing surfaces, of the element. Preferably, the layer of photopolymeric material is continuous throughout the thickness of the layer, i.e., radially from the surface of the support to the exterior surface of the photopolymerizable layer, and along an axial length of the element. The presence or absence of a line of demarcation or joining of photopolymeric material can be detected by using the element in printing tests. An example of the printing tests includes overall exposing the exterior surface of the element, essentially forming solid areas of no relief upon processing, and printing the solid areas. Any defects associated with a demarcation line or joining of the photopolymeric material would be detected by such a test. Printing tests can also include formation of a relief image on the element and printing the image to check for defects.

For the photosensitive element in the form of a seamless photopolymeric sleeve, the support is at least one polymeric film which is formed into a hollow cylinder. The support can be made of any polymeric material which is transparent or substantially transparent to actinic light, dimensionally stable and which is non-reactive and remains stable throughout the processing conditions. The polymeric materials described above for use as a flexible support are also suitable as a cylindrical support.

In order for the element to be readily mounted onto a printing cylinder, the support is a hollow cylinder having a uniform inner diameter. The support is expandable and contractible since it readily and repeatably mounts and dismounts from printing cylinders. The support must be able to grip the print cylinder without slippage, i.e., elastically expandable diametrically. Typically an interference fit with the print cylinder of 3 to 15 mils is preferred. The support should be expandable with the 40 to 100 psig air generally available in printing facilities and should expand sufficiently so they are easily slid over the print cylinder, so that an expansion exceeding the amount of interference fit is required. The support should have an outer surface free from irregularities that cause printing defects and have a uniform wall thickness which results in a difference in diameter (i.e., trueness) of the outer-wall surface when mounted on the print cylinder of less than 5 mils (0.013 cm) and preferably less than 1 mil (0.0025 cm).

In the preferred embodiment, the seamless photopolymeric sleeve includes at least one photopolymerizable seamless layer. Preferably the seamless photopolymerizable layer is an outermost layer of the element, i.e., the photopolymerizable layer having the printing surface. The at least one photopolymerizable layer is seamless in that the layer is a continuum of photopolymeric material formed from a hot melt of polymer or from a solid (i.e., cooled) photopolymeric layer which is heated to polymeric hot melt. At least the printing surface of the photopolymerizable layer is seamless, forming a continuum of photopolymeric material which is free of lines of demarcation or joining.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet. Alternatively, the photopolymerizable material can be placed between the support and the temporary coversheet in a mold. The layers of material are then pressed flat by the application of heat and/or pressure.

The surface of the photopolymerizable layer opposite the support is an exterior surface which must be tacky or substantially tacky, i.e., be sticky or have an oilyness to the touch of the surface of the layer. The exterior surface of the photopolymerizable layer must be tacky enough to secure an overall layer of powder material on the surface of the element. If more than one photopolymerizable layer is present in the element, the exterior surface of the outermost layer must be tacky or substantially tacky. The entire exterior surface of the photopolymerizable layer is tacky or substantially tacky. Typically the surface of the photopolymerizable layer in flexographic printing elements is inherently tacky due to the elastomeric binder and/or to migratory compounds, such as monomer and plasticizer, in- the photopolymerizable layer.

The photosensitive element includes a covering or layer of solid, particulate material, preferably powder material and more preferably fine powder, on the exterior surface of the photopolymerizable layer. Preferably the entire exterior surface of the photopolymerizable layer is covered with the layer of powder material. The powder contacts the exterior surface of the photopolymerizable layer. The tackiness of the exterior surface of the photopolymerizable layer assures adherence of the powder material to the photopolymerizable layer. A layer of powder material may be formed which completely covers the surface of the photopolymerizable layer and renders the entire exterior surface of the photosensitive element non-tacky or substantially non-tacky. Typically the layer of powder material is a monolayer but can be multiple layers of powder in order to render the exterior surface of the photopolymerizable layer tack-free. The powder material is not normally selectively applied, e.g., imagewise applied, to the exterior surface since the exterior surface is not treated or exposed to selectively create tacky and non-tacky areas. However, the powder material may be added to an imageable portion of the photopolymerizable layer leaving a portion of the surface of the photopolymerizable layer without a powder covering. Depending upon end-use, the layer of powder material can be transparent or opaque to the radiation which induces photoreaction in the photopolymerizable layer, e.g., actinic radiation.

The powder material can be organic, inorganic, mixtures of organic and inorganic compounds, or multicomponent. The powder material can include additives. The powder material is preferably a fine powder having a wide range of particle sizes. The powder material can be colorless to form the transparent layer on the photosensitive element. Alternately, the powder material can be colored which includes black, to form the opaque layer on the element. The powder material after application to the tacky exterior surface of the photopolymerizable layer renders the surface or a portion of the surface tack-free or substantially tack-free.

Colorless powder material forms a layer on the photosensitive element which is transparent or substantially transparent to actinic radiation. A transparent or substantially transparent layer is one which permits all or at least a significant portion of the transmitted amount of actinic radiation to the underlying photopolymerizable layer so that a significant amount of photoinduced reaction occurs in the photopolymerizable layer. The transparent layer of colorless particles can be clear or hazy provided that a significant amount of actinic radiation is transmitted through the layer. The thickness of the layer of colorless powder material is not particularly critical provided that the surface of the element is tack-free at least in the area which is contacted by a phototool after application of the powder.

A transparent layer of powder material can provide a surface on the element which is comparable to a release surface. In this instance, the powder layer provides a tack-free surface for placement and easy removal of a film, e.g., phototool, from the photosensitive element. Also, the transparent layer of powder can modify the surface characteristics, such as, surface roughness, ink pickup and ink release, of the photosensitive element. A sufficiently roughened exterior surface of the photosensitive element can eliminate the need for matte agent in films which are used as phototools. The matte agent in the phototool assures intimate contact between the phototool and the element upon exposure in vacuum. Also, the transparent layer of powder can alter the ink pickup, or ink release characteristics of the element during printing. Ink pickup is the ability of a printing plate to take up ink from a supply source. Ink release is the ability of a printing plate to apply ink to the printed matter.

Colorless powder material suitable for use includes, but is not limited to, polyethylene (PE) powders, polytetrafluoroethylene (PTFE) powders, diatomaceous silicas, cellulose acetates, as well as conventional matte agents, such as silica, rice starch, polymethylmethacrylate powders. Other inorganic particles suitable for use includes but is not limited to titanium oxide, zinc oxide, magnesium oxide and alumina.

Powder material having color includes pigment particles, toner particles, mixtures of pigment particles, mixtures of toner particles and mixtures of pigment and toner particles. Colored powder material forms a layer which is opaque or substantially opaque to actinic radiation. An opaque or substantially opaque layer is one which the amount of actinic radiation transmitted to the underlying photopolymerizable layer is so minuscule that no significant amount of photoinduced reaction occurs in the photopolymerizable layer. The layer of color powder material provides the opacity to block radiation transmitted to the underlying photopolymerizable layer. The color powder layer should also be insensitive to the radiation which induces photoreaction in the photopolymerizable layer, e.g., actinic radiation. The color powder layer on the photosensitive element can be ablated by laser radiation. The layer of color powder material on the photosensitive element can be imagewise ablated with laser radiation to form an in-situ mask on the element. Since the layer of color powder material can be ablated and can block transmitted radiation, the color powder layer can function similar to a laser radiation sensitive coating layer as disclosed in U.S. Pat. No. 5,262,275. However, unlike the laser radiation sensitive coating layer of U.S. Pat. No. 5,262,275 and related applications, the color powder usually can not be easily removed as a complete or discrete film layer from the photosensitive element. Also, the laser radiation sensitive layer applied as a solvent coating gives significantly less covering power than this invention which relates to a non-film like covering of solid, particulate material or powder adhering to a tacky photopolymerizable layer. The solid, particulate material could be applied in solvent or solution or dispersion form as long as a discrete, film-like layer is not formed. Furthermore, the solvent should be chosen so that no leaching of constituents in the photopolymerizable layer occurred e.g.-the monomer and other migratable components in the photopolymerizable layer should be insoluble in the solvent or solution utilized to apply the powder material.

Pigment particles as colored powder material can be in crystallite form or may be aggregates. Pigment particles suitable for use can be any provided the pigment provides the desired opacity as a layer as well as other desired characteristics. Examples of pigment particles include but is not limited to, Toluidine Red (C.I. Pigment Red 3), Toluidine Yellow (C.I. Pigment Yellow 1), copper phthalocyanine crystals, quinacridone crystals, Toluidine Red YW, Watchung Red BW (C.I. Pigment Red 48), Toluidine Yellow GW (C.I. Pigment Yellow 1), Monastral Blue BW (C.E. Pigment Blue 15), Monastral Green BW (C.I. Pigment Green 7), Pigment Scarlet (C.I. Pigment Red 60), Auric Brown (C.I. Pigment Brown 6), Monastral Green (Pigment Green 7) and. Monastral Maroon B and Monastral Orange. Also suitable as pigment particles are carbon black, graphite, copper chromite, chromium oxides and cobalt chrome aluminate; and metals such as aluminum, copper or zinc, and alloys of bismuth, indium, and copper.

Toner particles are pigmented organic resin particles which comprise pigment particles finely dispersed in a resin matrix which is then ground to the desired particle size. Pigmented organic resin particles are described in Chu and Manger in U. S. Pat. No. 3,620,726; Vesce in U.S. Pat. No. 2,649,382; and Gray in U.S. Pat. No. 3,909,282 which are hereby incorporated by reference. Pigments suitable for use in the toner particles can be any including those mentioned above, provided the toner provides the desired opacity to the particles as well as other desired characteristics. Suitable resin matrices include, but not limited to, polyvinyl chloride, cellulose acetate, cellulose acetate butyrate, polystyrene, polymethyl methacrylate. Also useful are water soluble polymer matrices, for example, polyvinyl alcohol, methyl cellulose, carboxymethyl cellulose. The particular matrix being used depending on the mechanical means of processing the toner down to the desired effective particle size, desired opacity, and desired ablation sensitivity. Provided that the toners impart the desired characteristics as a powder material on the element, toners suitable for use as the powder layer are not limited and can include toners used for pre-press proofing systems as well as electroconductive toners used in xerographic copy systems. Particularly preferred toners are black toners sold by DuPont as Cromalin® black toners, e.g., Cromalin® type KK6 black toner e.g. a carbon black and cellulose acetate blend.

The color of the powder material is not particularly critical provided that the color of the powder layer absorbs the laser radiation used to imagewise ablate the layer and the color powder material layer provides desired opacity to the photopolymerizable layer. The material in this layer should be ablatable or removable or transferable (e.g. via a peelable coversheet or via laser exposure through a support) from the photopolymerizable layer such that a mask is formed. If a color powder material is not both sensitive to laser radiation and provides opacity as a layer, then more than one color powder material could be used. For example, one color powder material could be sensitive to the laser radiation and another color powder material could be a radiationabsorbing material, and mixture of which would form the layer on the element. Also, the photoinitiator and other ingredients in the photopolymerizable layer must be insensitive to the laser radiation used to ablate the color powder layer to form the in-situ mask, otherwise some laser radiation will be absorbed by the photopolymerizable layer and the photopolymerizable layer will be ablated or polymerized at the same time especially at higher laser energies. It is within the ordinary skill in the art to appropriately choose laser radiation and a color of powder material combination in which the powder material absorbs the laser radiation and blocks the radiation which induces photoreaction, i.e., initiates photopolymerization, in the photopolymerizable layer, as well as assure that the initiator and other ingredients in the photopolymerizable layer is insensitive to the laser radiation for the desired product and process.

It is preferred to use a color powder material which is black, such as carbon black or a black toner, when the laser radiation is infrared; The black powder both absorbs the infrared laser radiation and blocks the actinic radiation. As initiators used in the photopolymerizable layer are often sensitive to actinic radiation in the ultraviolet and/or visible region, a layer of black powder is particularly effective in providing UV/visible opacity. The initiator should also be insensitive to the infrared laser radiation.

In addition to providing the working surface of the element tack-free after application (e.g., the imageable portion), the color powder material layer on the element should be optimized for both sensitivity and opacity to provide high covering power. The layer should be thin enough to provide good sensitivity, i.e., the powder layer should be removed rapidly upon exposure to laser radiation. At the same time the layer should be opaque enough so that the areas of the layer which remain on the photopolymerizable layer after imagewise exposure effectively mask the photopolymerizable layer from actinic radiation. High covering power of the powder layer achieves high optical density with minimum thickness of the layer. It is preferred that the layer of colored powder material have a transmission optical density greater than 2.0, so that the layer prevents the transmission of actinic radiation to the photopolymerizable layer.

For the purpose of determining the particle size of the powder material, particles can be measured for example by a Coulter Counter, Coulter Electronics, Inc. Hialeah Fla. The term particle size as used herein with respect to the powder material covers the size distribution of the smallest, independently acting unit. The size of powder particles suitable for use in this invention is less than 50 microns, and preferably for fine powder particles, the size ranges from 0.01 to 30 micrometers. The particle size of a powder material can be adjusted to achieve desired particle size by for example, milling, and as disclosed in Vesce in U.S. Pat. No. 2,649,382.

Powder material may be dispersed with wetting aids, surfactants, extenders softeners, and other adjuvants to adjust particle size and to facilitate handling or in the process of use. The surface of powder particles can be modified with for example, antistatic agents and slip agents, to provide the particles with desired characteristics. Various types of known antistatic agents are useful for treating and coating the surface of the particles. Useful antistatic agents include anionic, cationic, amphoteric, and nonionic antistatic agents. Slip agents which are useful for treating and coating the particulate toner surface in cooperation with the above described antistatic agents include silicone oil having a weight average molecular weight of 230 to 50000, saturated hydrocarbons having a weight average molecular weight of about 200 to 10000, and fluorocarbon compounds having a weight average molecular weight of 500 to 500000. Additives can be included to the powder material to improve covering power and uniform application of the powder material as a layer.

When the powder material is applied to the photopolymerizable layer it imparts a dry, non-tacky finish to the surface of the photosensitive element. The powder material can be applied to the exterior surface by hand dusting techniques as described in U.S. Pat. Nos. 3,060,024; and 3,620,726 or by mechanical means such as applicators and automated toning machines as described in U.S. Pat. Nos. 3,980,047; 4,019,821; 4,087,279; and 4,069,791. Hand and automatic application of powder materials, in particular toners, is also described in "DuPont Proofing System Manual", in the section on making Cromalin® proofs, distributed by DuPont. Hand application is usually accomplished by dipping a pad of tufted material into a tray containing the powder material, applying the powder material in excess and wiping the pad over the entire tacky surface of the photosensitive element. The powder material adheres to the photopolymerizable layer and reduces the tackiness of the layer. Excess material is then wiped off. Application of powder material in excess and wiping over the entire tacky surface of the element is considered one toning cycle. Additional powder material can be supplied to the surface with additional toning cycles to assure complete coverage of the entire surface of the element. Application of powder material forms a layer which leaves a tackfree dry finish, i.e., there is no resistance or tackiness over time to the touch. Generally, no additional steps after the application of powder material, such as heating or pressure or exposure to light, is needed to assure adherence of the layer of powder material to the photopolymerizable layer. Generally, the tackiness or lack of tackiness of the powder material layer will be apparent relatively quickly, i.e., immediately, after application of the powder material onto the photopolymerizable layer.

It is a particular advantage to use a layer of powder material on the exterior surface of a seamless continuous form which is applied in a dry manner, i.e., not involving solvents, and which provides seamless coverage. Also, an infrared-sensitive layer applied from a coating solution which ultimately results in a film-like covering can give significantly less covering power than by the dry process if the traditional coating process is utilized. A release layer or an infrared-sensitive layer applied by solution coating methods onto the exterior surface of seamless continuous forms which produces a film-like layer may crack over time presumably due to leaching of ingredients in the photopolymerizable layer into the solvent solution and evaporation of the solvent as well as expansion and contraction of the form for printing purposes.

Process for Preparing a Flexographic Printing Plate from the Photosensitive Element As discussed above, the selection of the solid, particulate material or the powder material depends upon the desired function of the material on the photosensitive element used as a flexographic printing element. The colorless powder material forms a layer on the photosensitive element which is transparent or substantially transparent to actinic radiation. In this instance, the process of preparing a flexographic printing plate from the photosensitive element having the transparent layer of powder material is substantially the same as conventional flexographic plate making, e.g., providing a phototool on the element, overall exposing the element through the phototool, and treating to form a relief printing plate.

Colored powder material forms a layer which is opaque or substantially opaque to actinic radiation. In this instance, the process of preparing a flexographic printing plate from the photosensitive element having the opaque layer of powder material includes a laser ablation step to form an in-situ mask on the element, followed by overall exposing and treating to form a relief plate.

Additionally, the photosensitive element of this invention can be engraved with laser radiation, such as $CO_2$ laser. The powder layer on the photosensitive element can be transparent or opaque depending upon process conditions for engraving.

For photosensitive elements having a color powder layer, the process to make a flexographic printing plate includes imagewise ablation of the powder layer or selective adherence by laser radiation to form an in-situ mask (e.g. "imagewise removal"). Typically, the laser radiation impinges the side of the photosensitive element bearing the powder material layer. Removal may also occur via laser exposure through the support side to ablate the infrared sensitive material off the photopolymerizable layer. Imagewise removal may also occur via careful selection of an infrared transferable material which selectively adheres to an infrared transparent coversheet upon exposure to radiation to, upon removal of the coversheet form a mask on the photopolymerizable layer. In the imagewise ablating step, material in the powder layer is removed imagewise, i.e., ablated in the areas exposed to the laser radiation, from the photosensitive element. The areas exposed to laser radiation in the powder layer correspond to those areas in the photopolymerizable layer which will be polymerized to form the final printing plate. After laser ablation, a pattern of actinic radiation opaque material remains on the photopolymerizable layer. The areas in which the powder layer remains correspond to the areas of the photopolymerizable layer which will be washed out in the formation of the final printing plate.

It is preferred when the color of the powder material is black, that the imagewise ablation exposure can be carried out using various types of infrared lasers. Diode lasers emitting in the region of 750 to 880 nm and Nd:YAG lasers emitting at 1060 nm are effective. If the color of the powder material is other than black (and not transparent), the wavelength of the laser radiation which ablates the powder material should be selected so as to be absorbent to the color of the powder and not initiate photoreaction in the laser exposed photopolymerizable layer. The process of the invention usually includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it take place prior to the overall exposure to actinic radiation through the mask. Any of the conventional radiation sources discussed below for the overall exposure step can be used for the backflash exposure step. Exposure time generally range from a few seconds up to a few minutes.

A step of the process of the invention is to overall expose the photosensitive element to actinic radiation through a mask, that is, imagewise exposure of the element. The type of radiation used is dependent on the type of photoinitiator in the photopolymerizable layer. The mask can be a photo-tool film (e.g. negative or positive) as is conventional in the art, or can be provided in-situ by laser ablation of the powder material layer on the element.

It is also contemplated that a mask can be provided on the transparent powder layer of the photosensitive element by imagewise application of opaque material, such as for example conductive particulate materials and inkjet inks. The process excludes (or does not include) imagewise application of an ink-jet ink directly onto the surface of a coverfilm on a photosensitive element or a photosensitive element.

In addition to ablation of the infrared sensitive material, this material may also be imagewise exposed with infrared radiation through an infrared transparent coversheet which, in a positive or negative fashion, selectively adheres some of the solid, particulate material to leave a photomask on the photopolymerizable layer. For photosensitive elements of this invention having a transparent powder layer, the phototool film is placed directly on this layer. Dark areas of the image in the phototool prevent the photopolymerizable material beneath from being exposed to the radiation and hence those areas of the photopolymerizable layer covered by the dark areas do not polymerize. The "clear" areas of the phototool expose the photopolymerizable layer to actinic radiation and polymerize. Similarly, for the in-situ mask, the areas remaining of the opaque layer on the photopolymerizable layer prevent the photopolymerizable material beneath from being exposed to the radiation and hence do not polymerize. The ablated areas of the opaque layer transmit the actinic radiation to expose the photopolymerizable layer and polymerize.

Any conventional sources of actinic radiation can be used for the overall exposure step and the backflash exposure step. Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

The actinic radiation exposure time can vary from a few seconds to minutes, depending upon the intensity and spectral energy distribution of the radiation, its distance from the photosensitive element, and the nature and amount of the photopolymerizable composition. Typically a mercury vapor arc or a sunlamp is used at a distance of about 1.5 to about 60 inches (3.8 to 153 cm) from the photosensitive element. Exposure temperatures are preferably ambient or slightly higher, i.e., about 20° C. to about 35° C.

Conventionally, imagewise exposure of the photosensitive element to actinic radiation is conducted in a vacuum eliminating the presence of atmospheric oxygen. The exposure is conducted in a vacuum to assure intimate contact between the phototool (e.g., negative) and the surface of the photopolymerizable layer and to prevent oxygen from detrimentally affecting the polymerization reactions occurring in that layer. It is contemplated that a device to assure intimate contact of the phototool to the surface of a rotary cylinder for gravure applications could be used in the present instance to assure contact of the phototool to a seamless continuous form. In the case where the mask is formed in-situ or applied imagewise with opaque material on the photopolymerizable layer, there is no need for vacuum to assure intimate contact. In the process of preparing a flexographic printing sleeve, the overall exposure step can be conducted in a vacuum, but preferably is conducted without vacuum, i.e., while the photosensitive element is in the presence of atmospheric oxygen.

Following overall exposure to actinic radiation through the mask, the element is treated by washing with a suitable developer. If the mask is a phototool, the phototool is removed prior to treating the element. The treating step removes at least the photopolymerizable layer in the areas which were not exposed to actinic radiation, i.e., the nonpolymerized areas of the photopolymerizable layer. The powder layer may remain or be removed entirely from the polymerized areas of the photosensitive element after washout. If the powder material was colored, the areas of powder material which were not removed during the laser ablation step are removed upon-treatment. If the mask was formed by imagewise application of opaque material on the transparent powder layer, the mask is removed upon treatment. Additional post-treatment steps such as additional washing or brushing with a different solvent may be necessary to remove powder layer from the element if desired:

Development is usually carried out at about room temperature. The developers can be organic solutions, water, aqueous or semi-aqueous solutions. The choice of the developer will depend on the chemical nature of the photopolymerizable material to be removed. Suitable organic solution developers include aromatic or aliphatic hydrocarbon and aliphatic or aromatic halohydrocarbon solutions, or mixtures of such solutions with suitable alcohols. Other organic solution developers have been disclosed in published German Application 38 28 551 and in U.S. Pat. No. 5,354,645. Suitable semi-aqueous developers usually contain water and a water miscible organic solution and an alkaline material. Suitable aqueous developers include water, water with an alkaline material, or water with one or more surfactants. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to remove the unexposed portions of the element, leaving a relief constituting the exposed image and the floor.

Following washout treatment, the photosensitive element has a relief surface and the printing plates are generally blotted or wiped dry, and then dried in a forced air or infrared oven. Drying times and temperatures may vary, however, typically the plate is dried for 60 to 120 minutes at 60° C. High temperatures are not recommended because the support can shrink and distort, causing mounting and registration problems.

Alternatively, it is contemplated that the photosensitive element having a powder layer (transparent or opaque) thereon can be overall exposed to actinic radiation first and then subjected to laser engraving with laser radiation to remove the powder layer and engrave the photopolymerizable layer, forming a relief printing plate. When the powder layer is transparent, the photosensitive element can be exposed overall from the support side or the powder layer side of the element. If the powder layer is opaque, the overall exposure can be done through the support side of the element only and if the support is transparent to such radiation. The overall exposure is a blanket exposure. The photosensitive element is photochemically reinforced before engraving by overall exposing the element to actinic radiation as disclosed by Cushner et al. in International Publications WO 93/23252 and WO 93/23253. Laser engraving involves the absorption of laser radiation, localized heating, and removal of material in three dimensions. The areas of the element which are exposed to a beam of laser radiation of sufficient intensity become physically detached, i.e., removed or loosened particles capable of being removed by mechanical means, with sufficient resolution and relief depth to be suitable for flexographic applications. Areas not struck by the laser radiation are not removed. Laser engraving does not involve the use of a mask or stencil since the laser impinges the element to be engraved at or near its focus spot. Engraving with laser radiation a preselected pattern forms a relief structure in the element. A preferred laser for engraving of flexographic printing elements is the $CO_2$ laser, which operates around a wavelength of about 10 micrometer. Since a relief structure is formed by laser engraving, a treating step to washout unpolymerized areas of the photopolymerizable layer is not necessary. However, a brief cleaning step to remove engraved debris may be required.

Most flexographic printing elements are uniformly postexposed to ensure that the photopolymerization process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher U.S. Pat. No. 4,400,459, Fickes et al., U.S. Pat. No. 4,400,460 and German Patent 28 23 300. Detackification can also be accomplished by exposure to radiation sources having a wavelength not longer than 300 nm, as disclosed in European Published Patent Application 0 017927 and Gibson U.S. Pat. No. 4,806,506.

Cylindrical photopolymerizable elements are wellsuited for mounting on conventional rotating drum mounted equipment. Thus, imagewise exposure, overall exposure, development and any additional process steps can be performed while the element is in cylindrical form. Conducting exposure and processing steps with a cylindrical element may provide additional advantages including increased process speed, better registration and reduced or in some cases no extra mounting time, reduced press-ready time, and increased press printing speed. In particular, the cylindrical photopolymerizable element are well-suited for mounting on conventional laser exposure equipment in which the element can be mounted directly the drum or replace the drum (with, for example, cones supporting each end of the element) for the laser exposure step. Exposure by a laser offers additional advantages of digitally imaging the cylindrical photopolymerizable element by laser ablation of the powder layer on the element or by laser engraving of the element as disclosed by Cushner et al. in International Publications WO 93/23252 and WO 93/23253.

Those skilled in the art, having benefit of the teachings of the present invention as hereinabove set forth, can effect numerous modifications thereto. These modifications are to be construed as being encompassed within the scope of the present invention as set forth in the appended claims.

EXAMPLES

Example 1

This example demonstrates that the surface characteristics, i.e., roughness and tackiness, of a photopolymerizable printing element can be modified by using powder materials.

For each of the powder materials tested, the coversheet of a commercially available Cyrel® 112HOS flexographic printing element (sold by DuPont, Wilmington, Del.) was discarded and the release layer was removed using tape. The resulting element surface (photopolymerizable layer) was tacky.

The modified element was hand-toned with a pad for 20 cycles with a colorless powder and the excess powder was removed with a piece of Lastic cloth. The resulting plate surface became tack-free as desired for different classes of materials as-exemplified with the following powders. The powders used were: (1a) Microfine® MF-6FX polyethylene wax powder, having an average particle size of one micron, (sold by Durchem Commodities Corporation, Harrison, N.Y.); (1b) Fluo® 300 polytetrafluoroethylene (PTFE) powder, having an average particle size of 3 microns, (sold by Micro Powders Incorporated); (1c) Monal® 300 alumina powder, having a median particle size of 8.7 microns, (sold by Aluminum Company of America, Pittsburgh, Pa.); (1d) Syloid® 234 silica powder; and, (1e) TW-6 cellulose acetate powder having an average particle size of 4.3 micron, (sold by DuPont, Wilmington Del.).

Example 2

This example demonstrates that the photosensitive printing element having a tack-free surface provided by a powder layer can be subsequently exposed and processed similar to conventional printing elements having a release layer.

The printing elements from Example 1 having a powder layer of Monal® 300, Fluo® 300 and Syloid® 234 were each given a back flash exposure of 40 seconds in the air. A silver halide target (i.e., phototool) was placed on the element adjacent to the powder layer on the element, a vacuum was pulled, and then given a main exposure of 11 minutes through the target. No problems were observed during this operation and the targets were removed easily from the plates after the main exposure.

The exposed printing elements were developed in a Cyrel® rotary processor with Perclene and butanol (3:1) solvent mixture for 5.5 minutes. The plates were dried in the oven (60° C.) for two hours.

As a control, a Cyrel® 112HOS printing element with the release layer intact on the element was backflashed exposed for 40 seconds with the coversheet on. The coversheet was removed, the element was imagewise exposed with the target in a vacuum and then processed as described above.

The unexposed areas for all three toned plates washed off to provide about 71 mil floor depth or 41 mil relief depth. Good images (2–95% dot, 120 lpi) were obtained for all toned plates and were comparable to the control.

The plate having the Monal® 300 powder gave dull and rough surface appearance and the surface was tackfree. The plate having the Syloid® 234 powder gave semi-glossy appearance and the surface was tack-free. The plate having the Fluo® 300 powder gave semi-glossy appearance and the surface was tacky. The surface tackiness of this plate suggests that the Fluo® powder had been developed off from the plate. The control had glossy appearance and tacky surface. This demonstrated that the surface tackiness and surface characteristics of an element can be modified by application of a powder layer to the element.

The surface of the toned and fully exposed solid element was examined under a digital image analyzer (a microscope having an associated computer which calculates measured dimensions) under 260× magnification. The surface with Monal® powder showed biggest particles and roughest surface on the plate as expected. Each of the surfaces of the elements with Fluo® and Syloid® powder showed smaller particles and some surface roughness. The control (with the release layer) gave smooth surface and glossy appearance.

In addition, the surface of the exposed and processed (washed off in developer) plates which had the powder layer thereon gave similar rougher surfaces under the digital image analyzer. This showed that the process of applying the powder on the plate surface could change the surface roughness for the developed plates. This approach can be used to show, for example, that the silver halide target may not need to have matte surface in those cases when the printing element surface is rough.

Example 3

The processed printing plates from Example 2 were printed on a Mark Andy press using an aqueous black ink.

The plates having Fluo® 300 and Syloid® 234 powder layers gave comparable ink density as the control plate. The plate having the Monal® 300 powder layer gave slightly lower density than the control plate but better shadow printing.

Example 4

This example demonstrates that a photopolymerizable printing element having a layer of powder which is infrared sensitive and UV opaque can be used for a digital imaging application.

A commercially available Cyrel® 67HOS printing element (available from DuPont) was used. The coversheet was discarded and the release layer was removed with tape. The surface of the resulting element was tacky and was pad toned with a black toner, Cromalin® proofing toner type KK6, (available from DuPont) for 20 cycles. The excess toner was removed by using Lastic cloth. The toner adhered to the surface and the surface of the element became tack-free as desired. The optical density for the black layer was 3.43 as measured with Macbeth 904 transmission densitometer with visual filter.

The resulting element was imagewise laser ablated using a Nd:YAG laser with laser energy of 2.5 Joules/cm$^2$. Good in-situ mask was obtained as desired and the solid ablated areas had a stain level of 0.15.

The laser ablated element was given a backflash exposure of 17 seconds, and a main exposure in air through the in-situ mask side for 10 minutes on the Cyrel® 3040 light source. It was developed in Optisol® developer in the In-line Cyrel® 1001 processor. The resulting plate was free of any black materials as desired. It was dried in the 60° C. oven for one hour, and post exposed and light finished on the Cyrel® post processing unit for 10 minutes. Good images were obtained and the relief depth was 30 mils.

Example 5

A commercially available Cyrel® 67HCS printing element was used instead of 67HOS in Example 4. The coversheet and the release layer were removed from the element. The element was wrapped on a mandrel and secured with a double-sided tape. The mandrel was manually turned while the toning pad flooded with the Cromalin® proofing toner type KK6 powder was moving across the length of the mandrel. After 20 toning cycles, the excess toner was removed: The toned black density was 2.10 and the element surface was tack-free as desired. The resulting element was imagewise laser ablated with laser energy of 1.5 Joules/cm² as described in Example 4. Good in-situ mask was obtained as desired and the ablated solid areas had a stain level of 0.04.

The resulting plate was exposed and processed as in the Example 4 and 2–95k (120 lpi) tonal range was resolved.

Example 6

The following Example demonstrates the use of different toners with different treatments and elements were investigated for the in-situ mask formation for digital plate application using the procedure as in the Example 5. The results were as follows and they all gave tack-free toned surface as desired.

| Plate | Toning Cycles | Toner | Black Density | Ablation Energy J/cm² | Stain Density |
|---|---|---|---|---|---|
| 67 HOS | 23 | Cromalin® KK6 BP | 2.66 | 2.5 | 0.19 |
| 67 HCS | 30 | Cromalin® KK6 CN | 2.31 | 1.5 | 0.07 |
| 67 HCS | 30 | Carbon Black [1] | 2.60 | 2.0 | 0.03 |

[1] Carbon Black particulate was identified as Black Pearls 130, supplied by Cabot Corp. (Billerica, MA).

Good image was obtained for all three processed plates

Example 7

A black toner for the copier from Lanier Worldwide Inc., (Atlanta, Ga.), was used as the powder material and was applied to Cyrel® 67HCS and 67HOS printing elements using the same procedure in Example 4. The reported toner components were styrene acrylate copolymer, carbon black, polypropylene and inorganic pigment. The toning cycle was 20. The resulting elements had black density of 1.02 for the 67HCS element and 1.15 for 67HOS element. The toned 67HCS element was imagewise laser ablated with 2.0 Joules/cm² laser energy. It gave high stain of 0.51. The element was exposed and processed as described above. The processed plate gave poorer results because of the high stain level and low black mask density.

Example 8

The following example demonstrates application of a toner onto a hollow cylindrical photopolymeric sleeve element.

A seamless photopolymer sleeve (134 mil) was prepared with a photopolymer composition as follows
Photosensitive Element The photopolymerizable hot melt was composed of the following ingredients wherein all percentages are by weight, unless otherwise indicated.

| Kraton® 1107 | Linear styrene-isoprene-styrene block copolymer (from Shell Chemical Co.) | 72.64 |
| Shellflex® | Hydrocarbon oil | 7.9 |
| Piccotex® 100S | Substituted polystyrene | 5.79 |
| Ceresin Wax | Hydrocarbon wax | 0.97 |
| HMDA | 1,6-hexamethylenediol diacrylate | 5.09 |
| HMDMA | 1,6-hexamethylenediol diacrylate | 3.57 |
| HEMA | Hydroxethylmethacrylate | 0.17 |
| Red dye | Neozapon® red dye | 0.004 |
| Irgacure® 651 | 2,2-dimethoxy-2-phenylacetophenone | 1.94 |
| BHT | Butyrated hydroxy toluene | 1.92 |

Apparatus

The apparatus included a mandrel and three calendar rolls surrounding the mandrel. The mandrel had 3 rows of 7 openings drilled at an angle and equally spaced to allow air to the circumferential surface of the mandrel to facilitate the movement of a sleeve or a sleeve having a photopolymerizable layer thereto, on and off of the mandrel. The three calendar rolls were made of 316 stainless steel each having a layer of Silverstone® protective coating to provide a release surface on the calender rolls. The calender rolls were skewed 1.5 degrees relative to the mandrel. The apparatus had the following start-up conditions.

The temperature of the calender rolls was 275° F. (135° C.). The calender rolls rotated at 22.2 rpm. The gap between the surface of the calender rolls and the circumferential surface of the mandrel was about 165 mil (0.42 cm) when the calender rolls were in position close to the mandrel for calendering of the photopolymerizable layer. Air was being sent to the mandrel openings. The mandrel was unlocked and was permitted to rotate.

A twin screw extruder, (made by Werner & Pfleiderer) was used to extrude the above photopolymerizable hot melt to the above calendering apparatus. The extruder did not use a die. Instead, the hot melt polymer extruded from an outlet 3/8 in. (0.95 cm) diameter in noodle form. The ingredients for the photopolymerizable hot melt were fed into the extruder.
Process to Prepare A Cylindrical Photopolymerizable Element A polyester sleeve, commercially available as Cyrel® Print Sleeve, made by E. I. DuPont de Nemours (Wilmington, Del.) was used. The polyester sleeve was transparent to actinic light. The sleeve had an axial length of 12 in. (30.5 cm), a wall thickness of 40 mils (0.10 cm) and an inside diameter of 3.521 in. (8.9 cm). The sleeve was inserted on the mandrel, so that an end of the sleeve last on the mandrel was all the way to a drive side of the apparatus and beyond the calender rolls. The air to the mandrel was turned off.

With the sleeve being rotated on the mandrel manually, the hot melt was extruded in noodle form from the outlet onto the sleeve. The extruder was positioned such that an outlet of the extruder fed the hot melt onto the sleeve on the mandrel adjacent to a calender roll of the apparatus. The polymer was extruded at 20 lbs/hr (9.1 kg/hr) at a temperature of about 120° C. Once the gap between the sleeve and the calender rolls was filled with the photopolymerizable hot melt, the coated sleeve turned on its own and manual rotation was no longer required. The air was on during the run to allow easy turning and advancing of the sleeve towards the exit end of the apparatus. The coated sleeve was traveling at an axial advancing rate of about 6 inches/minute (15.24 cm/min).

A cylindrical photopolymerizable element having a thickness of 165 mils (0.42 cm), which is the thickness of the photopolymerizable layer and the sleeve, was successfully demonstrated.

Process to Make Photosensitive Element having a Powder Layer

The photopolymer sleeve was placed onto a mandrel and an exterior surface of the sleeve, i.e., exterior surface of the photopolymer layer, was toned with Cromalin® KK6 BP toner for 30 cycles as described in Example 5. The sleeve surface became tack-free. There was no seam in the black toner layer as desired, and the black density was 2.75.

The powder layer on this toned sleeve can then be ablated imagewise using infrared laser radiation to form an in-situ mask, overall exposing through the mask, and processing, to provide a seamless continuous relief printing form.

Example 9

A seamless photopolymer sleeve with photopolymer composition was prepared as described in Example 8. The exterior surface of the sleeve was pad toned with the TW6 cellulose acetate toner for 20 cycles. It gave tack-free surface and without any seams as desired.

This toned sleeve can then be exposed by analog method, i.e., by overall exposing through a phototool placed on the toned layer, and processing, to provide a seamless continuous relief printing form.

Comparative Examples

The following comparative examples demonstrate the effect on the element of various methods of applying an infrared-sensitive, actinic radiation opaque layer from a coating solution onto a photopolymerizable layer.

A Cyrel® flexographic printing element having a photopolymerizable layer on a support was used. A release layer of Macromelt® polyamide may have been included on the exterior surface of the photopolymerizable layer as described in the table below.

An infrared sensitive solution was prepared. A binder of 50 parts of a polyamide, Macromelt® 6900 (from Henkel Corp., Minneapolis, Minn.) was precompounded with 50 parts of carbon black in a Moriyama mixer. An infrared sensitive composition was prepared by mixing parts of the precompounded carbon black-polyamide with parts of the polyamide in a solvent blend of 80/20 propanol/toluene, to arrive at the percentage of carbon black in binder detailed in the table below.

As a control, the infrared sensitive composition was coated on 5 mil Mylar® polyester film using reverse roll coating method and dried. The infrared sensitive layer (IR layer) on the film was placed in contact with the printing element without release layer present and laminated to the element by pressing. The temporary Mylar® support was removed.

For the comparative examples, the printing element was mounted onto a mandrel (the support against the mandrel and the photopolymerizable layer (and release layer) facing outward) and the infrared sensitive composition was spray coated as a layer (IR layer) directly to the exterior surface of the printing element.

For the Control and the spray coated samples, the dried coating weight and density (read by a MacBeth RD 904 densitometer with a visual filter) were determined for infrared sensitive layer. The table below demonstrates the effect of the application method on density, coating weight and physical appearance of the element.

| Application Method | Support | % of Carbon Black in Binder | Density of IR Sens. Layer | Ctg. Wt. of IR layer (mg/dm$^2$) | Appearance | Comments |
|---|---|---|---|---|---|---|
| Control-(Reverse roll coated on support) | Mylar ® | 33 | 2.5–2.9 | 23 | glossy | |
| Spray (5% solid in solvent) | Printing element with release layer | 33 | 2.5 | 46 | grainy | cracks appear after about 3 weeks |
| Spray (5% solid in solvent) | Printing element without release layer | 33 | 2.25 | 67.7 | grainy | |

It was determined that the infrared-sensitive laser ablation layer is extremely demanding. The application method for the layer affects the covering power significantly, and thus the ablation performance.

When compared to the previous examples in which the infrared sensitive layer was a powder layer (in Examples 4 through 7), the comparative examples had cracks or grainy appearance.

The preceeding examples are non-limiting and the present invention also includes variations within the scope of or equivalent to the following claims. The element having a powder layer recited herein which does not form a discrete film-like ablation layer or which does not crack upon desolution may require lower laser ablation energy than those elements which form discrete film-like infrared sensitive layers or which form cracks upon desolution or which have low covering power (i.e., the comparative examples). The preferred powder layer provides high covering power and also requires lower laser energy to effectively ablate and form the in-situ mask than those systems described previously or known heretofore.

What is claimed is:

1. A method for making a flexographic printing plate from a photosensitive element which comprises:
    (a) a support shaped into a hollow cylinder;
    (b) at least one seamless photopolymerizable layer on an exterior surface of the support comprising an elastomeric binder, at least one monomer and an initiator, an entire exterior surface of the photopolymerizable layer opposite the support being tacky or substantially tacky, said cylindrical support and seamless photopolymerizable layer being expandable and contractible; and
    (c) a non-film layer of particulate powder material on the exterior surface of the photopolymerizable layer, wherein the powder layer is opaque and insensitive to actinic radiation and renders the surface tack-free, comprising
        (1) imagewise removing areas of the powder layer from the cylindrical element, to create an in-situ cylindrical mask;
        (2) overall exposing the photopolymerizable layer through the cylindrical mask with actinic radiation to form an imagewise exposed element;
        (3) treating the element of step (2) with a solution to remove the areas of the photopolymerizable layer which were not exposed to actinic radiation and the areas of the mask not removed in step (1).

2. The method of claim 1 further comprising prior to the treating step, backflash exposing the element overall to actinic radiation through the support.

3. The method of claim 1, further comprising a post-exposure step after the treating step.

4. The method of claim 1, further comprising a detackification treatment after the treating step.

5. The method of claim 4 wherein the detackification treatment comprises exposure to light having a wavelength less than 300 nm.

6. The method of claim 1 wherein the imagewise removing is by laser radiation.

7. The method of claim 6 wherein the laser radiation is 750 nm to 1060 nm and the powder absorbs infrared radiation.

8. The method of claim 7 wherein the powder is black and the laser radiation is 1060 nm.

\* \* \* \* \*